United States Patent
Yoshikawa et al.

(10) Patent No.: US 8,477,821 B2
(45) Date of Patent: Jul. 2, 2013

(54) VERTICAL CAVITY SURFACE EMITTING LASER, VERTICAL CAVITY SURFACE EMITTING LASER DEVICE, AND OPTICAL TRANSMISSION DEVICE

(75) Inventors: Masahiro Yoshikawa, Kanagawa (JP); Hideo Nakayama, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 89 days.

(21) Appl. No.: 12/861,438

(22) Filed: Aug. 23, 2010

(65) Prior Publication Data
US 2011/0182314 A1 Jul. 28, 2011

(30) Foreign Application Priority Data
Jan. 25, 2010 (JP) .................................. 2010-012993

(51) Int. Cl.
*H01S 5/00* (2006.01)
(52) U.S. Cl.
USPC ..................................................... 372/50.124
(58) Field of Classification Search
USPC .............. 438/39; 257/22, 13, 79; 372/50.124, 372/92
See application file for complete search history.

(56) References Cited

U.S. PATENT DOCUMENTS

2004/0165636 A1* 8/2004 Ezaki et al. ..................... 372/46
2005/0121678 A1* 6/2005 Ezaki et al. ..................... 257/79
2010/0208760 A1* 8/2010 Yoshikawa ................ 372/44.01

FOREIGN PATENT DOCUMENTS

JP A-8-181391 7/1996
JP A-11-330630 11/1999

* cited by examiner

*Primary Examiner* — Jessica Stultz
*Assistant Examiner* — Tuan Nguyen
(74) *Attorney, Agent, or Firm* — Oliff & Berridge, PLC

(57) ABSTRACT

A vertical cavity surface emitting laser that includes: a substrate; a first reflector of a first conductive type formed on the substrate; an active region formed on the first reflector; a second reflector of a second conductive type formed on the active region; and a current confining layer formed between the first reflector and the second reflector; and a metallic electrode that is formed on the second reflector, and is electrically connected to the second reflector. A conductive region with an anisotropy where a length in a longitudinal direction is different from a length in a short direction is formed in the current confining layer, and an opening defining a beam aperture is formed in the metallic electrode, and a diameter of the opening in the longitudinal direction is smaller than the length of the conductive region in the longitudinal direction.

5 Claims, 8 Drawing Sheets

CROSS-SECTION VIEW TAKEN
FROM LINE A-A

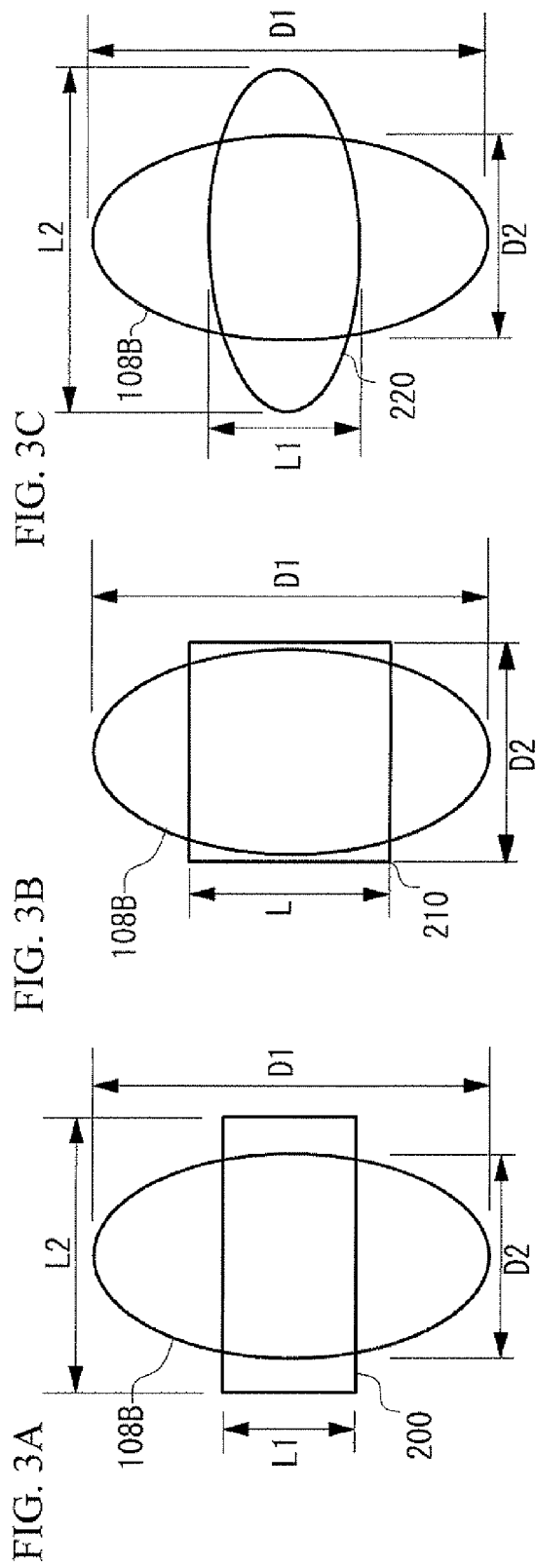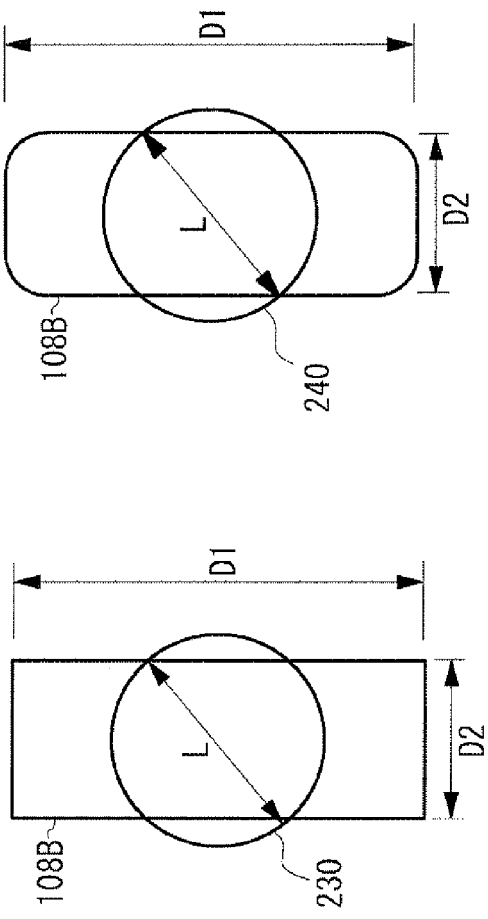

US 8,477,821 B2

VERTICAL CAVITY SURFACE EMITTING LASER, VERTICAL CAVITY SURFACE EMITTING LASER DEVICE, AND OPTICAL TRANSMISSION DEVICE

CROSS-REFERENCE TO RELATED APPLICATION

This application is based on and claims priority under 35 USC 119 from Japanese Patent Application No. 2010-012993 filed on Jan. 25, 2010.

BACKGROUND (i) Technical Field

The present invention relates to a vertical cavity surface emitting laser, a vertical cavity surface emitting laser device, and an optical transmission device.

(ii) Related Art

A vertical cavity surface emitting laser (VCSEL) is used as a light source in a communication device and an image forming apparatus. Typical selective oxidation type vertical cavity surface emitting lasers locate a current confining layer where an oxidized aperture is formed with selective oxidization in the structure of a vertical resonator. An oxidized aperture has a function of injecting current with high density into an active region, and a function of confining the light generated in the active region in a light emission center by using a difference between refractive indexes of the inside and the outside of the oxidized aperture. Single lateral mode is preferable for a vertical cavity surface emitting laser used as a light source in a electronic apparatus. Therefore, a diameter of an oxidized aperture is designed to be small.

SUMMARY

According to an aspect of the present invention, there is provided a vertical cavity surface emitting laser comprising: a substrate; a first semiconductor multilayer reflector of a first conductive type formed on the substrate; an active region formed on the first semiconductor multilayer reflector; a second semiconductor multilayer reflector of a second conductive type formed on the active region; a current confining layer formed between the first semiconductor multilayer reflector and the second semiconductor multilayer reflector; and a metallic electrode that is formed on the second semiconductor multilayer reflector and is electrically connected to the second semiconductor multilayer reflector, wherein a conductive region with an anisotropy where a length in a longitudinal direction is different from a length in a short direction is formed in the current confining layer, and an opening defining a beam aperture is formed in the metallic electrode, and a diameter of the opening in the longitudinal direction is smaller than the length of the conductive region in the longitudinal direction.

BRIEF DESCRIPTION OF THE DRAWINGS

Exemplary embodiments of the present invention will be described in detail based on the following figures, wherein:

FIGS. 3A through 3E are diagrams to explain variant exemplary embodiments of the vertical cavity surface emitting laser in accordance with the exemplary embodiment, and a relation between a current confining layer and a p-side electrode;

DETAILED DESCRIPTION

A description will now be given, with reference to the accompanying drawings, of exemplary embodiments of the present invention. In the following description, a selective oxidation type vertical cavity surface emitting laser will be exemplified, and a vertical cavity surface emitting laser is abbreviated as a VCSEL. The scale in drawings is exaggerated to understand the feature of the present invention, and is not same as the scale of actual devices.

Exemplary Embodiment

Figure 1:
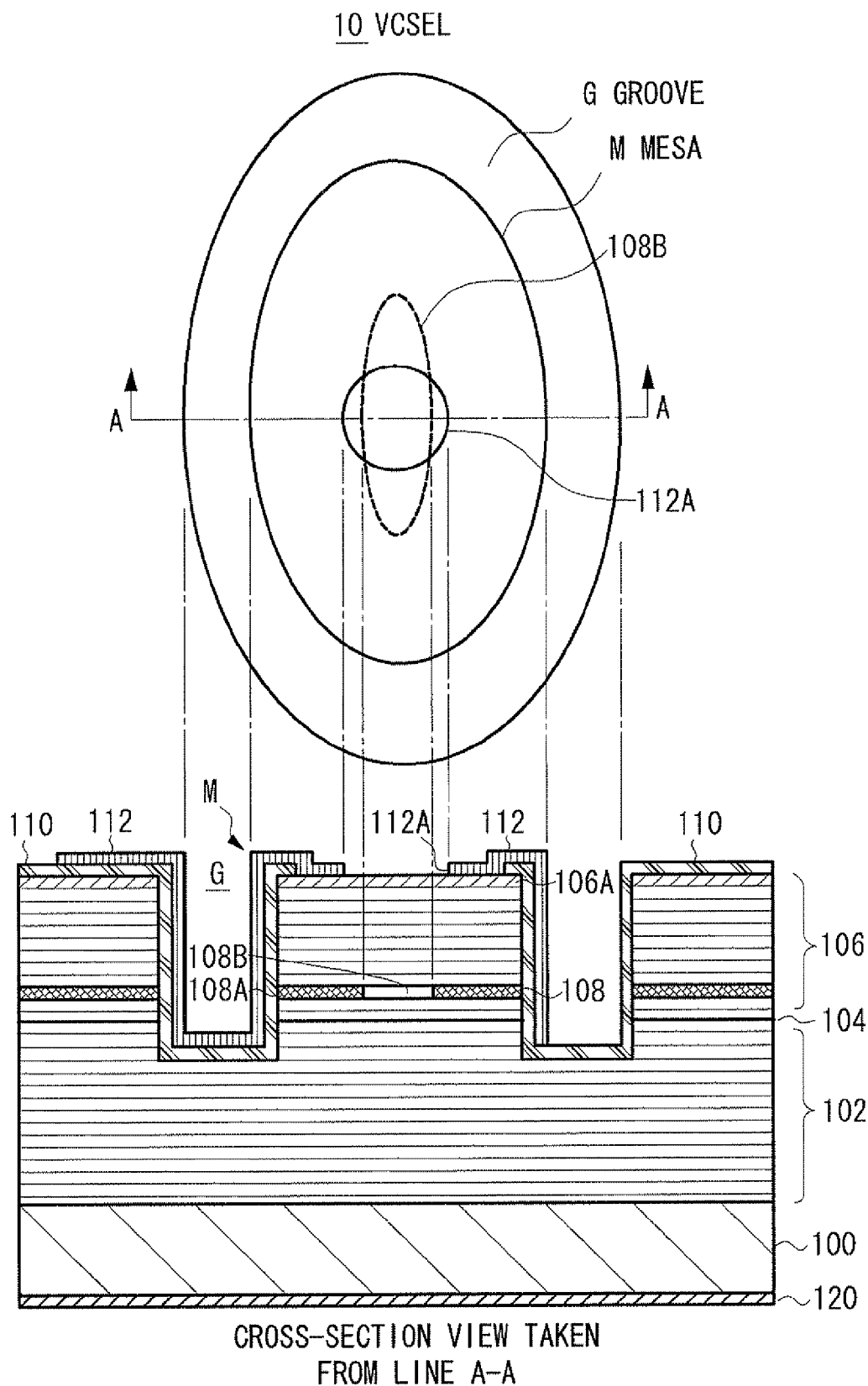
FIG. 1 illustrates a plane view, and a cross-section view taken along a line A-A of a vertical cavity surface emitting laser in accordance with an exemplary embodiment of the present invention.

FIG. 1 is a plane view and a cross-section view taken along a line A-A of a VCSEL in accordance with an exemplary embodiment of the present invention. As illustrated in FIG. 1, a VCSEL 10 of the exemplary embodiment is formed by stacking an n-type lower Distributed Bragg Reflector (hereinafter, abbreviated as DBR) 102, an active region 104, and a p-type upper DBR 106 on an n-type GaAs substrate 100. The n-type lower DBR 102 is formed by stacking AlGaAs layers with different Al composition alternately. The active region 104 includes a quantum well active layer formed on the lower DBR 102, and sandwiched between upper and lower spacer layers. The p-type upper DBR 106 is formed by stacking AlGaAs layers with different Al composition on the active region 104 alternately.

The n-type lower DBR 102 is a multi-layer stack formed by a pair of an Al0.9Ga0.1As layer and an Al0.15Ga0.85As layer for example. The thickness of each layer is $\lambda/4n_r$ ($\lambda$ is an oscillation wavelength, and $n_r$ is a refractive index of the medium), and the $Al_{0.9}Ga_{0.1}As$ layer and the $Al_{0.15}Ga_{0.85}As$ layer are stacked alternately 40.5 periods. The lower spacer layer of the active region 104 is an undoped $Al_{0.6}Ga_{0.4}As$ layer, quantum well active layers are an undoped $Al_{0.11}Ga_{0.89}As$ quantum well layer and an undoped $Al_{0.3}Ga_{0.7}As$ barrier layer, and the upper spacer layer is an undoped $Al_{0.6}Ga_{0.4}As$ layer. The p-type upper DBR 106 is a multi-layer stack formed by a pair of an $Al_{0.9}Ga_{0.1}As$ layer and an $Al_{0.15}Ga_{0.85}As$ layer for example. The thickness of each layer is $\lambda/4n_r$, and the $Al_{0.9}Ga_{0.1}As$ layer and the $Al_{0.15}Ga_{0.85}As$ layer are stacked alternately 30 periods. A contact layer 106A comprised of p-type GaAs is formed at a top layer of the upper DBR 106, and a current confining layer 108 comprised of p-type AlAs is formed at a bottom layer of the upper DBR 106 or inside of the upper DBR 106. It is preferable that the current confining layer 108 is close to the active region 104.

A circular groove G is formed on the substrate by etching a semiconductor layer from the upper DBR 106 to the lower DBR 102, and this forms a elliptical mesa (a columnar structure) M on the substrate. The current confining layer 108 is exposed on the side surface of the mesa M, and has an oxidization region 108A which is selectively oxidized from the side surface, and a conductive region (oxidized aperture) 108B surrounded by the oxidization region 108A. In the oxidization process of the current confining layer 108, the oxidation rate of an AlAs layer is faster than that of an AlGaAs layer, and the oxidization proceeds from the side surface of the mesa M to the inside at an almost constant rate. Therefore, the planar shape of the surface, which is parallel to the principal surface of the substrate 100, of the conductive region 108B, becomes an elliptical shape (illustrated with dashed line in FIG. 1) which reflects the outer shape of the mesa M. That is to say that the planar shape of the mesa M is an elliptical shape which has a major axis (or longitudinal direction) and a minor axis (or short direction), and the planar shape of the conductive region 108B is an elliptical shape which has a major axis and a minor axis corresponding to those of the mesa M respectively. The center of the conductive region 108B where the major axis intersects with the minor axis corresponds to the axial center of the mesa M which means an optical axis. The diameter of the conductive region 108B in the minor axis direction may have the size at which the basic lateral mode oscillation occurs. For example, the diameter of the conductive region 108B in the minor axis direction may be equal to or less than 5 μm in a wavelength range of 780 nm. The anisotropic shape of the conductive region 108B makes a polarization control of a laser beam stable.

An interlayer insulating film 110 is composed of SiON, SiN or the like for example, and covers the surface of the upper DBR 106, the groove G, and the side surface and the part (edge) of the top of the mesa M. A contact hole, which is a circular opening, is formed at the interlayer insulating film 110 at the top of the mesa M, and a contact layer 106A is exposed by the contact hole.

A p-side electrode 112 is comprised of a metal formed by stacking Au or Ti/Au for example, and preferably is formed with a liftoff process. The p-side electrode 112 is electrically ohmic connected to the contact layer 106A through the contact hole of the interlayer insulating film 110 at the top of the mesa M. A circular opening 112A is formed in the p-side electrode 112 at the top of the mesa M, and this opening defines a beam aperture. The center of the opening 112A corresponds to the optical axis, and as described later, the diameter of the opening 112A is smaller than the diameter of the conductive region 108B on the major axis and larger than the diameter on the minor axis. It is not illustrated but the contact layer 106A exposed by the opening 112A may be protected by a beam protection film composed of a light transmissive material. An n-side electrode 120 which is electrically connected to the lower DBR 102 is formed on the back of the substrate 100.

Figure 2:
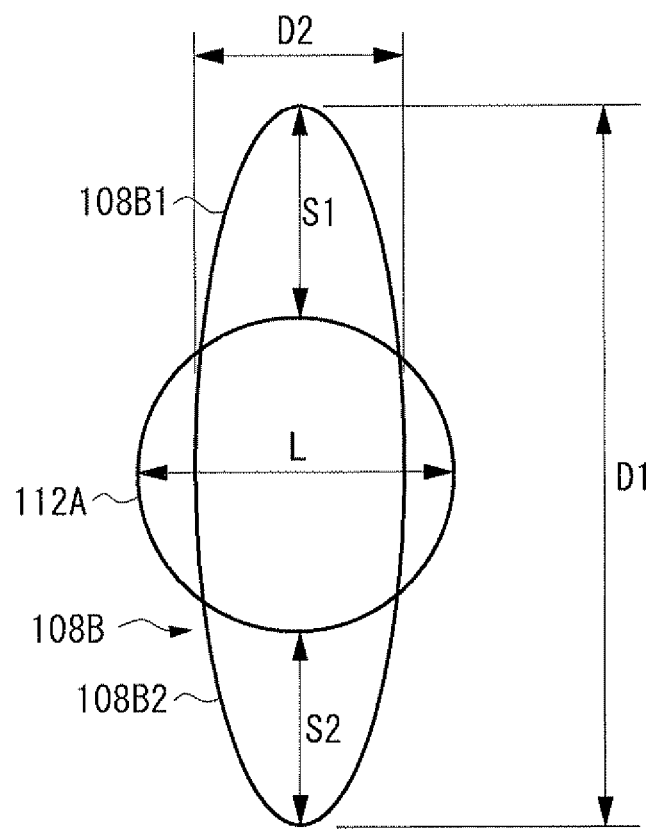
FIG. 2 is a diagram to explain a relation between a current confining layer and a p-side electrode of the vertical cavity surface emitting laser in accordance with the exemplary embodiment.

A description will now be given of a positional relation between the conductive region 108B of the current confining layer 108 and the opening 112A of the p-side electrode 112. FIG. 2 is a plane view illustrating a positional relation between the conductive region 108B and the opening 112A when the VCSEL is viewed from directly above and the opening 112A is projected to the conductive region 108B. The planar shape of the conductive region 108B is an elliptical shape having a major axis and a minor axis. Here, the length in the major axis direction is D1, and the length in the minor axis direction is D2 (D1>D2). The opening 112A of the p-side electrode 112 has a circular shape, and its diameter is L. Preferably, the center of the opening 112A corresponds to the intersection of the major axis with the minor axis of the conductive region 108B, L is smaller than D1, and L is larger than D2. Therefore, the both ends (sectorial parts) 108B and 108B2 of the conductive region 108B in the major axis direction overlap with the p-side electrode 112, and are shielded by the p-side electrode 112 practically.

The lengths S1 and S2 of both ends 108B1 and 108B2 of the conductive region 108B in the major axis direction are difference between the length D1 of the conductive region 108B in the major axis direction and the diameter L of the opening 112A. When the center of the opening 112A is aligned with the center of the conductive region 108B, S1 is equal to 52.

To obtain the basic lateral mode oscillation, the length D2 of the conductive region 108B in the minor axis direction is limited to 5 μm or less than 5 μm. On the other hand, to obtain a stable polarization control, it is desirable to make the length D1 of the conductive region 108B in the major axis direction large. However, when the length D1 becomes large, the oscillation in the high-order lateral mode (multi-mode) is easily created in the major axis direction. The diameter L of the opening 112A is designed to be slightly larger than the length D2 of the minor axis of the conductive region 108B in view of the spread angle of the laser beam, and the refractive ration on the minor axis side of the upper DBR 106 is not reduced. That is to say that the basic lateral mode oscillation is not suppressed in the minor axis direction of the conductive region 108B. On the other hand, the both ends 108B1 and 108B2 of the conductive region 108B on the major axis side are shielded by the p-side electrode 112 practically, the refractive index of both ends 108B1 and 108B2 of the upper DBR 106 on the major axis side is reduced, and the high-order lateral mode oscillation in the major axis direction is suppressed. Therefore, the basic lateral mode oscillation with high power, to which a polarization control is stably performed, is obtained When the differences S1 and S2 between the length D1 of the conductive region 108B in the major axis direction and the diameter L of the opening 112A become larger, the suppression ratio of the oscillation mode becomes higher, but the light output decreases. The lengths of S1 and S2 are adjusted in response to the oscillation mode suppression ratio which is necessary to obtain a required beam profile. The laser beam of which the monomodality is higher can be obtained by making S1 equal to S2.

In the above exemplary embodiment, the conductive region 108B of the current confining layer 108 has an elliptical shape, and the opening 112A of the p-side electrode 112 has a circular shape. However, they may have shapes other than those described above. In FIG. 3A, the conductive region 108B has an elliptical shape, and the opening 200 of the p-side electrode 112 has a rectangular shape. When the length of the rectangular opening 200 in the major axis direction of the conductive region 108B is L1, and the length of the rectangular opening 200 in the minor axis direction is L2 (L1<L2), L1 is smaller than D1 and L2 is larger than D2. Preferably, the intersection of the diagonal lines of the opening 200 corresponds to the intersection of the major axis with the minor axis of the conductive region 108B. Therefore, both ends of the conductive region 108B in the major axis direction overlap with the p-side electrode 112.

In FIG. 3B, the conductive region 108B has an elliptical shape, and the opening 210 of the p-side electrode 112 has a square shape. When the length of the side of the opening 210 is L, L is smaller than D1 and L is larger than D2. When the center of the opening 210 corresponds to the intersection of the major axis with the minor axis of the conductive region 108B, the both ends of the conductive region 108B in the major axis direction overlap with the p-side electrode 112.

In FIG. 3C, the conductive region 108B has an elliptical shape, and the opening 220 of the p-side electrode 112 has an elliptical shape. When the length of the opening 220 in the major axis direction of the conductive region 108B is L1, and the length of the opening 220 in the minor axis direction is L2, L1 is smaller than D1, and L2 is larger than D2. When the center of the opening 220 corresponds to the center of the conductive region 108B, the both ends of the conductive region 108B in the major axis direction overlap with the p-side electrode 112.

In FIG. 3D, the conductive region 108B has an rectangular shape, and the opening 230 of the p-side electrode 112 has a circular shape. When the length of the conductive region 108B in the longitudinal direction is D1, the length in the short direction is D2 (D1>D2), and the diameter of the opening 230 is L, L is smaller than D1, and L is larger than D2. When the center of the opening 230 corresponds to the intersection of the diagonal lines of the conductive region 108B, the both ends of the conductive region 108B in the longitudinal direction are shielded by the p-type electrode 112. The rectangular conductive region 108B can be formed to reflect the outer shape of the mesa by making the mesa M have a rectangular shape. The structure illustrated in FIG. 3E is same as that illustrated in FIG. 3D except that the corner of the conductive region 108B in FIG. 3E is chamfered.

The planar shape of the conductive region 108B may be other shapes as long as they have an anisotropy where the length in the longitudinal direction is different from that in the short direction like an elliptical shape or a rectangular shape. The shape of the opening of the p-side electrode 112 is not limited to a particular shape as long as it can shield the at least one end of the conductive region 108B in the longitudinal direction. In the same manner, the shape of the mesa M is not limited to an elliptical shape, and may be a rectangular columnar structure which has a longitudinal direction and a short direction.

Figure 4A:
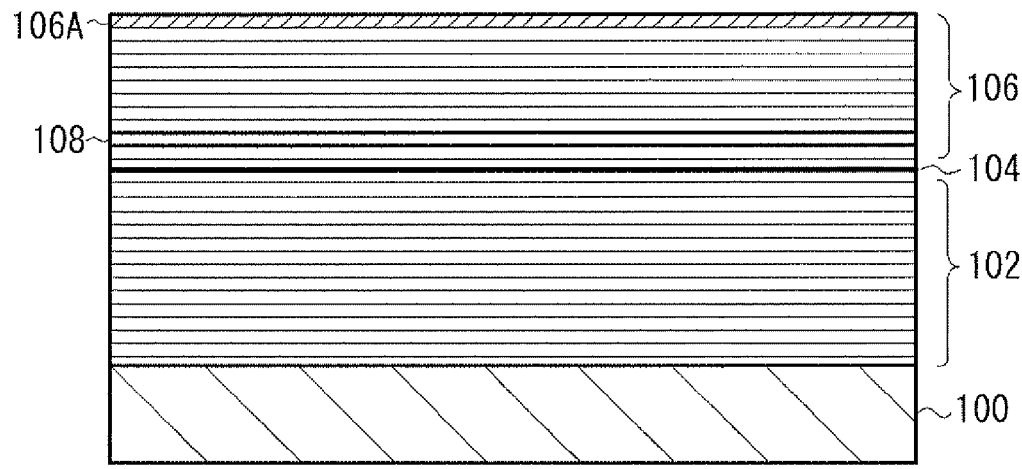
FIGS. 4A through 4C are cross-section views for explaining a fabrication process of the vertical cavity surface emitting laser in accordance with the exemplary embodiment.

A description will now be given of a preferable fabrication method of the VCSEL in accordance with the exemplary embodiment of the present invention, with reference to FIGS. 4A through 5C. As illustrated in FIG. 4A, an n-type GaAs buffer layer with a carrier concentration of $1 \times 10^{18}$ cm$^{-3}$ and a film thickness of about 0.2 μm is stacked on the n-type GaAs substrate 100 by the metal organic chemical vapor deposition (MOCVD) method (a buffer layer is not illustrated), and the n-type lower DBR 102 is stacked thereon. The n-type lower DBR 102 with is formed by stacking $Al_{0.9}Ga_{0.1}As$ and $Al_{0.15}Ga_{0.85}As$ with a carrier concentration of $1 \times 10^{18}$ cm$^{-3}$ alternately 40.5 periods so that each film thickness becomes quarter of the wavelength of the medium, and its total film thickness is about 4 μm. Then the active region 104 and the p-type upper DBR 106 are formed on it. The active region 104 is comprised of an undoped lower $Al_{0.6}Ga_{0.4}As$ spacer layer, an undoped quantum well active layer which is composed of three GaAs quantum well layers with a film thickness of 7 nm and four $Al_{0.3}Ga_{0.7}As$ barrier layers with a film thickness of 8 nm, and an undoped upper $Al_{0.6}Ga_{0.4}As$ spacer layer, and its film thickness is a wavelength of the medium. The p-type upper DBR 106 is composed by stacking $Al_{0.9}Ga_{0.1}$ As and $Al_{0.15}Ga_{0.85}As$ with a carrier concentration of $1 \times 10^{18}$ cm$^{-3}$ alternately 30 periods so that each film thickness becomes quarter of the wavelength of the medium, and the total film thickness of the p-type upper DBR 106 is about 2 μm. A p-type AlAs layer 108 with a thickness of about 20 nm is inserted to the bottom layer of the upper DBR 106 to carry out a selective oxidization. The p-type GaAs contact layer 106A with a carrier concentration of $1 \times 10^{19}$ cm$^{-3}$ and a film thickness of about 20 nm is formed at the top layer of the upper DBR 106.

A description will not be given in detail, but a region with a film thickness of about 20 nm where Al composition is gradually changed from 90% to 15% may be provided on the boundary face between Al0.9Ga0.1As and Al0.15Ga0.85As to reduce an electrical resistance of the DBR layer. Trimethylgallium, trimethylaluminium, and arsine are used as raw material gas, and cyclopentadienylmagnesium and carbon are used for the p-type and silane is used for the n-type as dopant materials. The substrate temperature for growing is 750° C. and a film is formed by changing raw material gasses sequentially with vacuum.

Figure 4B:
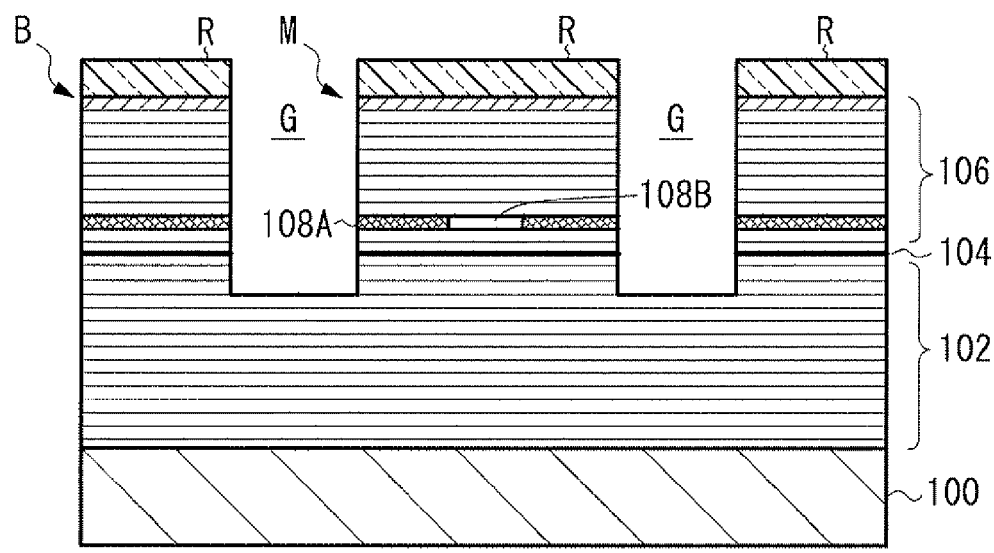

A resist mask R is formed on a crystal growing layer by the photolithography process as illustrated in FIG. 4B, and a circular groove G is formed by etching the lower DBR 102 to the middle of it by the reactive ion etching process using boron trichloride as an etching gas. This forms the elliptical mesa (a columnar structure) M on the substrate and a pad forming region B around the mesa M.

Then, after removing the resist mask R, the oxidization process that exposes the substrate to the water-vapor atmosphere with a temperature of 340° C. for a given time is carried out. As the oxidization rate of the AlAs layer comprising the current confining layer 108 is particularly fast compared to that of the $Al_{0.9}Ga_{0.1}As$ layer or $Al_{0.15}Ga_{0.85}As$ layer comprising a part of the current confining layer 108, the oxidization region 108A which reflects the shape of the mesa is formed from the side surface of the mesa M, and the un-oxidation region which is not oxidized and maintained becomes the conductive region 108B.

Figure 4C:
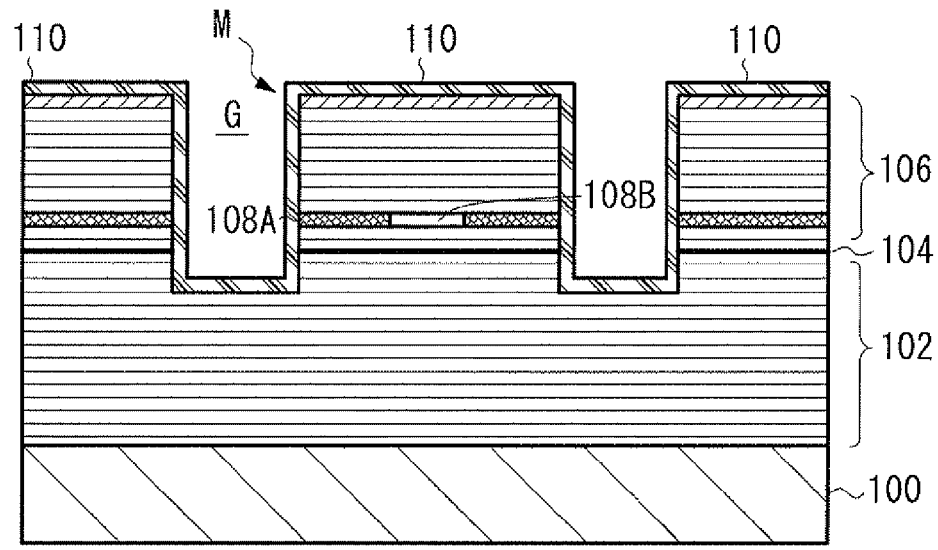
Figure 5A:
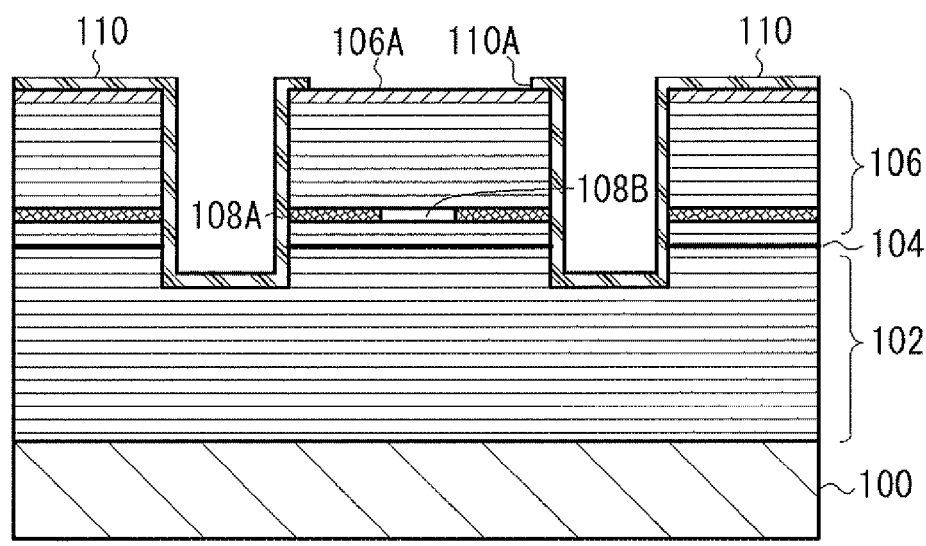
FIGS. 5A through 5C are cross-section views for explaining a fabrication process of the vertical cavity surface emitting laser in accordance with the exemplary embodiment.

Then, as illustrated in FIG. 4C, the interlayer insulating film 110 composed of SiN or the like is deposited on whole surface of the substrate including the groove G by using a plasma CVD device. After that, as illustrated in FIG. 5A, the interlayer insulating film 110 at the top of the mesa M is removed by etching the interlayer insulating film 110 with a normal photolithography process and a dry etching process, and the circular contact hole 110A is formed thereon.

Figure 5B:
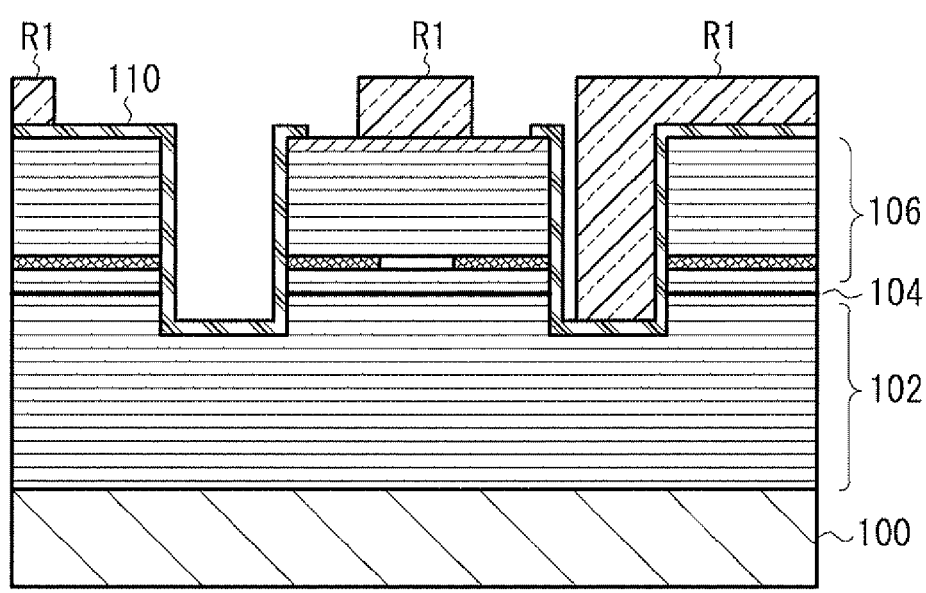
Figure 5C:
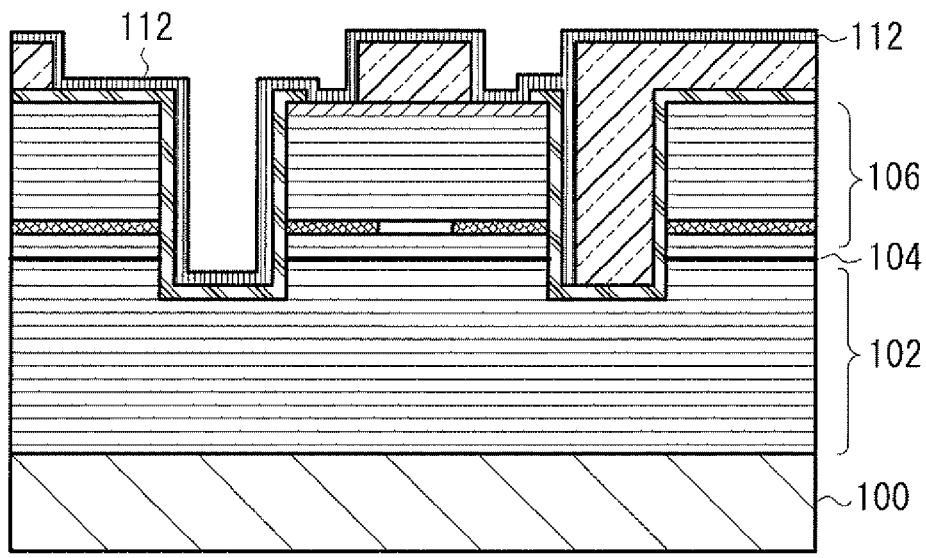

Then, as illustrated in FIG. 5B, a resist pattern R1 is formed by a photolithography process. Then, as illustrated in FIG. 5C, an Au layer 112 (or Au/Ti stacking layer) is evaporated as a p-side electrode material from above so that the thickness of the Au layer 112 becomes between 100 and 1000 nm, preferably 600 nm by using an EB evaporation apparatus. When the resist pattern R1 is exfoliated, Au on the resist pattern R1 is removed and the p-side electrode 112 is patterned as illustrated in FIG. 1. The opening 112A which is a beam aperture is formed at the top of the mesa M, and extraction lines expanding on the pad forming region B through the groove G are formed.

Au/Ge is evaporated on the back of the substrate as an n-side electrode. Then, anneal is carried out for ten minutes at the anneal temperature between 250° C. and 500° C., preferably between 300° C. and 400° C. The annealing time is not limited to ten minutes, and may be between zero and thirty minutes. The method of evaporation is not limited to the EB evaporation apparatus, and resistance heating methods, spattering methods, magnetron spattering methods, and CVD methods can be used. Annealing methods are not limited to a thermal anneal using a normal electric furnace, and a flash anneal and laser anneal using infrared rays, a high frequency heating, an anneal using electronic beam, an anneal with lamp heating can provide same effect.

According to the exemplary embodiment, the opening 112A is easily formed by changing the mask pattern of the resist pattern R1 to form the p-side electrode 112, and the mass production at low cost becomes possible.

In above exemplary embodiments, a description was given of a current confining layer comprised of AlAs, but a current confining layer may be an AlGaAs layer of which the Al composition is higher than the Al composition of other DBRs. In addition, in above exemplary embodiments, the description was given of a GaAs-based VCSEL, but the present invention can be applied to other VCSELs using other III-V group compound semiconductors. Furthermore, in above exemplary embodiments, the description was given of a single spot VCSEL, but the VCSEL can be a multi-spot VCSEL where multiple mesas (emission portion) are formed on the substrate, or a VCSEL array.

Figure 6A:
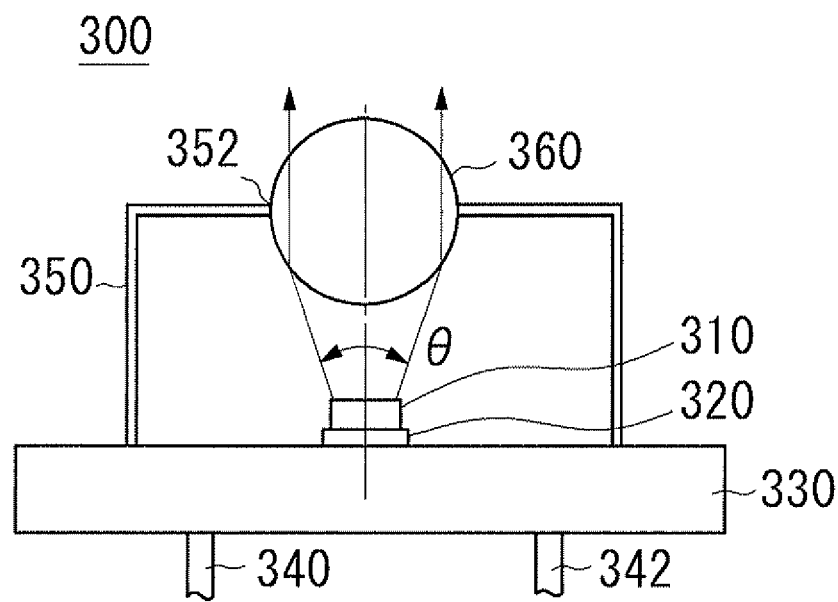
FIGS. 6A and 6B are schematic cross-section views illustrating a composition of a vertical cavity surface emitting laser device in which the vertical cavity surface emitting laser of exemplary embodiments and an optical component are packaged.

A description will be given of a vertical cavity surface emitting laser device, an optical information processing apparatus, and an optical transmission device using the VCSEL of exemplary embodiments with reference to drawings. FIG. 6A is a cross-section view illustrating a composition of a vertical cavity surface emitting laser device in which the VCSEL and an optical component are packaged. A vertical cavity surface emitting laser device 300 fixes a chip 310, on which a VCSEL is formed, to a disk-shaped metal stem 330 via a conductive bond 320. Conductive leads 340 and 342 are inserted in a through hole (not illustrated) provided to the stem 330, the lead 340 is electrically connected to the n-side electrode of the VCSEL, and the lead 342 is electrically connected to the p-side electrode.

A rectangular hollow cap 350 is fixed on the stem 330 including the chip 310, and a ball lens 360 is fixed in an opening 352 located in the center of the cap 350. The ball lens 360 is laid out so that the optical axis of the ball lens 360 corresponds to the substantial center of the chip 310. When a forward current is applied between leads 340 and 342, a laser beam is emitted from the chip 310 to the vertical direction. The distance between the chip 310 and the ball lens 360 is adjusted so that the ball lens 360 is included within the spread angle θ of the laser beam from the chip 310. A light receiving element and a temperature sensor to monitor the emitting condition of the VCSEL can be included in the cap.

Figure 6B:
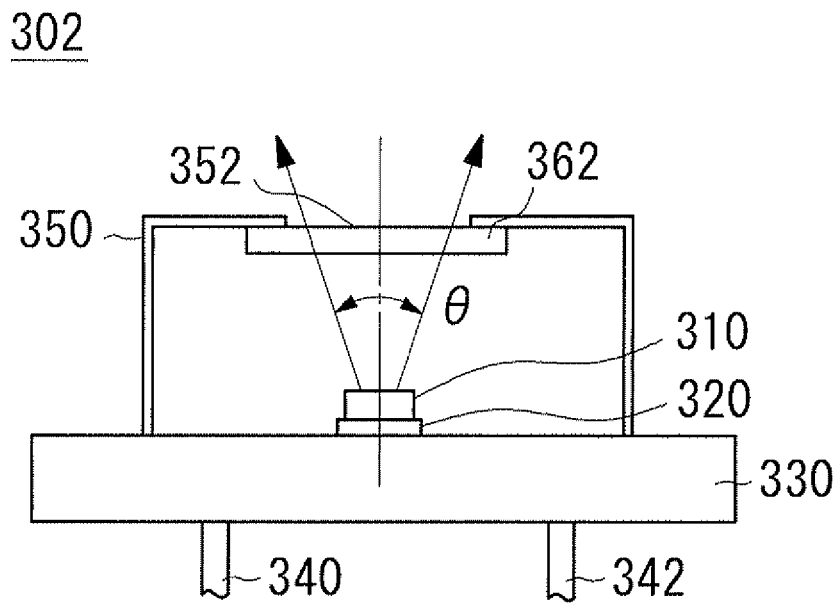

FIG. 6B is a diagram illustrating a composition of another vertical cavity surface emitting laser device. A vertical cavity surface emitting laser device 302 fixes a plane glass 362 in the opening 352 located in the center of the cap 350 instead of using the ball lens 360. The plane glass 362 is laid out so that the center of the plane glass 362 corresponds to the substantial center of the chip 310. The distance between the chip 310 and the plane glass 362 is adjusted so that the opening diameter of the plane glass 362 becomes equal to or larger than the spread angle θ of the laser beam from the chip 310.

Figure 7:
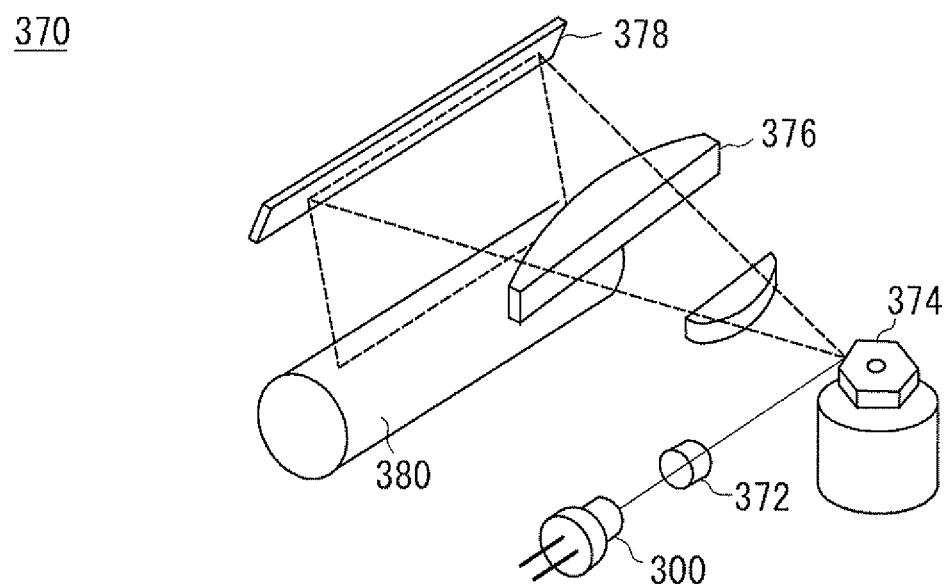
FIG. 7 is a diagram illustrating a composition of a light source device using the vertical cavity surface emitting laser of exemplary embodiments.

FIG. 7 is a diagram illustrating a case where the VCSEL is applied to a light source of an optical information processing apparatus. An optical information processing apparatus 370 is provided with a collimator lens 372 which receives the laser beam from the vertical cavity surface emitting laser device 300 or 302, in which the VCSEL is packaged, illustrated in FIG. 6A or 6B, a polygon mirror 374 which rotates at constant speed and reflects a beam of light from the collimator lens 372 at constant spread angle, a fθ lens 376 which receives the laser beam from the polygon mirror 374 and irradiates the laser beam to a reflection mirror 378, the linear reflection mirror 378, and a photoreceptor drum (a record medium) 380 which forms latent images based on the reflection beam from the reflection mirror 378. As described above, the laser beam from the VCSEL can be used as a light source of the optical information processing apparatus such as a copier and a printer provided with an optical system which focuses the laser beam from the VCSEL onto the photoreceptor drum and a structure which scans the focused laser beam on the photoreceptor drum.

Figure 8:
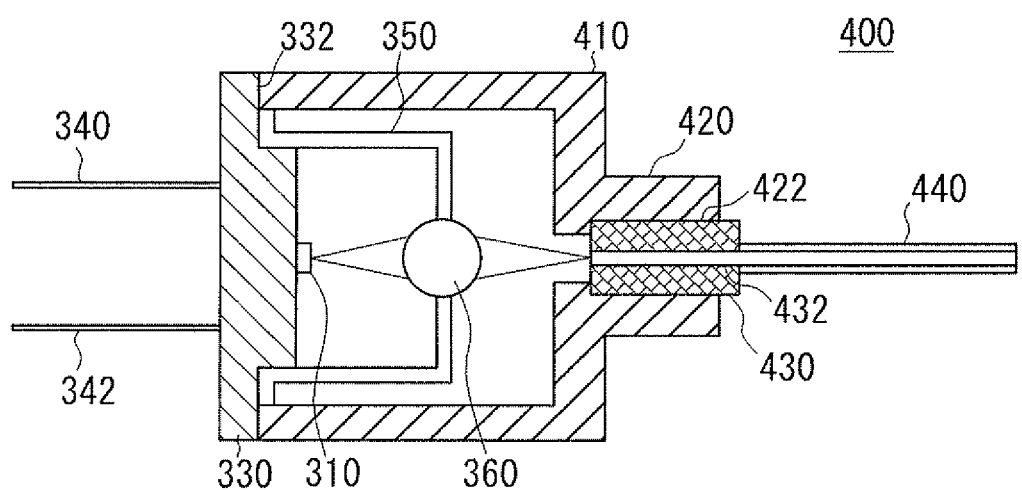
FIG. 8 is a schematic cross-section view illustrating a composition of an optical transmission device using the vertical cavity surface emitting laser device illustrated in FIG. 6A.

FIG. 8 is a cross-section view illustrating a composition where the vertical cavity surface emitting laser device illustrated in FIG. 6A is applied to an optical transmission device. An optical transmission device 400 includes a cylindrical chassis 410 fixed to the stem 330, a sleeve 420 integrally-formed on the end surface of the chassis 410, a ferrule 430 held in an opening 422 of the sleeve 420, and an optical fiber 440 held by the ferrule 430. The end portion of the chassis 410 is fixed to a flange 332 which is circumferentially-formed of the stem 330. The ferrule 430 is laid out in the opening 422 of the sleeve 420 accurately, and the optical axis of the optical fiber 440 is matched to the optical axis of the ball lens 360. The core of the optical fiber 440 is held in a through hole 432 of the ferrule 430.

The laser beam emitted from the surface of the chip 310 is focused by the ball lens 360. The focused beam enters to the core of the optical fiber 440, and is transmitted. In above exemplary embodiments, the ball lens 360 is used, but other lenses such as a biconvex lens and a plane-convex lens can be used besides a ball lens. Furthermore, the optical transmission device 400 can include a drive circuit to apply an electrical signal to leads 340 and 342. The optical transmission device 400 can also include a receiving function to receive an optical signal through the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A vertical cavity surface emitting laser comprising: a substrate; a first semiconductor multilayer reflector of a first conductive type formed on the substrate; an active region formed on the first semiconductor multilayer reflector; a second semiconductor multilayer reflector of a second conductive type formed on the active region; a current confining layer formed between the first semiconductor multilayer reflector and the second semiconductor multilayer reflector; and a metallic electrode that is formed on the second semiconductor multilayer reflector and is electrically connected to the second semiconductor multilayer reflector, wherein a conductive region with an anisotropy where a length in a longitudinal direction is different from a length in a short direction is formed in the current confining layer, an opening defining a beam aperture is formed in the metallic electrode, and a diameter of the opening in the longitudinal direction is smaller than the length of the conductive region in the longitudinal direction, both ends of the conductive region in the longitudinal direction overlap with the metallic electrode, a length of one end overlapping with the metallic electrode in a longitudinal direction is equal to the length of the other end, and a diameter of the opening in the short direction is larger than the length of the conductive region in the short direction, and a columnar structure is formed from the second semiconductor multilayer reflector to the first semiconductor multilayer reflector on the substrate; where a size of the columnar structure in a longitudinal direction being different from a size of the columnar structure in a short direction, the current confining layer is formed in the columnar structure, and the conductive region is surrounded by an oxidation region which is selectively oxidized from a side surface of the columnar structure.

2. The vertical cavity surface emitting laser according to claim 1, wherein a planar shape of the conductive region is an elliptical shape, and
a shape of the opening is a circular shape.

3. The vertical cavity surface emitting laser according to claim 1, wherein a planar shape of the conductive region is a rectangular shape; and
a shape of the opening is a circular shape.

4. A vertical cavity surface emitting laser device comprising: a vertical cavity surface emitting laser; and an optical member that receives a beam from the vertical cavity surface emitting laser, the vertical cavity surface emitting laser including: a substrate; a first semiconductor multilayer reflector of a first conductive type formed on the substrate; an active region formed on the first semiconductor multilayer reflector; a second semiconductor multilayer reflector of a second conductive type formed on the active region; a current confining layer formed between the first semiconductor multilayer reflector and the second semiconductor multilayer reflector; and a metallic electrode that is formed on the second semiconductor multilayer reflector, and is electrically connected to the second semiconductor multilayer reflector, wherein a conductive region with an anisotropy where a length in a longitudinal direction is different from a length in a short direction is formed in the current confining layer, and an opening defining a beam aperture is formed in the metallic electrode, and a diameter of the opening in the longitudinal direction is smaller than the length of the conductive region in the longitudinal direction, both ends of the conductive region in the longitudinal direction overlap with the metallic electrode, a length of one end overlapping with the metallic electrode in a longitudinal direction is equal to the length of the other end, and a diameter of the opening in the short direction is larger than the length of the conductive region in the short direction, and a columnar structure is formed from the second semiconductor multilayer reflector to the first semiconductor multilayer reflector on the substrate; where a size of the columnar structure in a longitudinal direction being different from a size of the columnar structure in a short direction, the current confining layer is formed in the columnar structure, and the conductive region is surrounded by an oxidation region which is selectively oxidized from a side surface of the columnar structure.

5. An optical transmission device comprising: a vertical cavity surface emitting laser device; and a transmission unit that transmits a laser beam emitted from the vertical cavity surface emitting laser device through an optical medium, the vertical cavity surface laser device including a vertical cavity surface emitting laser and an optical member that receives a beam from the vertical cavity surface emitting laser, the vertical cavity surface emitting laser device including: a substrate; a first semiconductor multilayer reflector of a first conductive type formed on the substrate; an active region formed on the first semiconductor multilayer reflector; a second semiconductor multilayer reflector of a second conductive type formed on the active region; a current confining layer formed between the first semiconductor multilayer reflector and the second semiconductor multilayer reflector; and a metallic electrode that is formed on the second semiconductor multilayer reflector, and is electrically connected to the second semiconductor multilayer reflector, wherein a conductive region with an anisotropy where a length in a longitudinal direction is different from a length in a short direction is formed in the current confining layer, and an opening defining a beam aperture is formed in the metallic electrode, and a diameter of the opening in the longitudinal direction is smaller than the length of the conductive region in the longitudinal direction, both ends of the conductive region in the longitudinal direction overlap with the metallic electrode, a length of one end overlapping with the metallic electrode in a longitudinal direction is equal to the length of the other end, and a diameter of the opening in the short direction is larger than the length of the conductive region in the short direction, and a columnar structure is formed from the second semiconductor multilayer reflector to the first semiconductor multilayer reflector on the substrate; where a size of the columnar structure in a longitudinal direction being different from a size of the columnar structure in a short direction, the current confining layer is formed in the columnar structure, and the conductive region is surrounded by an oxidation region which is selectively oxidized from a side surface of the columnar structure.

* * * * *